(12) United States Patent
Schönecker et al.

(10) Patent No.: US 11,621,385 B2
(45) Date of Patent: Apr. 4, 2023

(54) THERMOELECTRIC CONVERSION DEVICE AND METHOD FOR MANUFACTURING THE SAME

(71) Applicant: RGS Development B.V., Broek op Langedijk (NL)

(72) Inventors: Axel Georg Schönecker, Alkmaar (NL); Pierre-Yves Pichon, Noyal-sur-Vilaine (FR); Wilhelmus Gerardus Adrianus van Schaik, Maastricht (NL)

(73) Assignee: RGS Development B.V., Broek op Langedijk (NL)

( * ) Notice: Subject to any disclaimer, the term of this patent is extended or adjusted under 35 U.S.C. 154(b) by 0 days.

(21) Appl. No.: 16/978,251

(22) PCT Filed: Mar. 7, 2019

(86) PCT No.: PCT/EP2019/055759
§ 371 (c)(1),
(2) Date: Sep. 4, 2020

(87) PCT Pub. No.: WO2019/170826
PCT Pub. Date: Sep. 12, 2019

(65) Prior Publication Data
US 2020/0411741 A1    Dec. 31, 2020

(30) Foreign Application Priority Data

Mar. 7, 2018 (NL) .................................. 2020545

(51) Int. Cl.
*H01L 35/08*  (2006.01)
*H01L 35/22*  (2006.01)
*H01L 35/34*  (2006.01)

(52) U.S. Cl.
CPC .............. *H01L 35/08* (2013.01); *H01L 35/22* (2013.01); *H01L 35/34* (2013.01)

(58) Field of Classification Search
CPC ......... H01L 35/08; H01L 35/14; H01L 35/22; H01L 35/26; H01L 35/34
See application file for complete search history.

(56) References Cited

U.S. PATENT DOCUMENTS 6,271,460 B1 * 8/2001 Yamashita .............. H01L 35/32
                                                           136/205
2003/0091092 A1  5/2003 Engel et al.
(Continued)

FOREIGN PATENT DOCUMENTS

EP    0969526     1/2000
JP    H08148726   6/1996
(Continued)

*Primary Examiner* — Andrew J Golden
(74) *Attorney, Agent, or Firm* — N.V. Nederlandsch Octrooibureau

(57) ABSTRACT

A thermoelectric device includes active elements containing thermoelectric materials of silicon, an alloy of silicon, a metal-silicide or silicon composite and an interconnection zone consisting of a metal interconnect and a re-crystallized phase consisting of material from the active thermoelectric elements. The metal interconnect is from a metal that does not form metal silicides in a solid state, has a certain solubility for components of the thermoelectric elements in the liquid phase and a low solubility of these components in the solid phase. The active thermoelectric elements are shaped with a first and a second contact interface. The interconnection between the different thermoelectric elements consists of at least two phases of material, one of which is mainly the metallic interconnection material, the other is formed by the re-crystallized components of the thermoelectric materials.

10 Claims, 6 Drawing Sheets

(56) References Cited

U.S. PATENT DOCUMENTS

2004/0031515 A1* 2/2004 Sadatomi ............... H01L 35/22
136/239
2013/0247949 A1* 9/2013 Ila .......................... H01L 35/22
136/203

FOREIGN PATENT DOCUMENTS

| JP | H09100166 | 4/1997 |
|----|-----------|--------|
| JP | H1022530  | 1/1998 |

* cited by examiner

THERMOELECTRIC CONVERSION DEVICE AND METHOD FOR MANUFACTURING THE SAME

FIELD OF THE INVENTION

The present invention relates to a thermoelectric conversion device made from a silicon containing material. Additionally, the invention relates to a method for manufacturing such a thermoelectric conversion device.

BACKGROUND

Thermoelectric elements based upon bismuth telluride containing materials are well known and largely applied in different applications. However due to the material properties of bismuth telluride materials, such devices are typically limited to a maximum operating temperature of 250° C. In the so called high-temperature range with hot side device operating temperatures of more than 500° C., these materials are no longer useful.

On the other side, silicon, silicon composites, silicon alloys and metal-silicide based thermoelectric conversion devices offer the promise to become low cost, environmentally benign thermoelectric devices that are very well suited for high temperature operation with device hot side temperatures above 500° C. Consequently, such devices are ideal candidates for applications in e.g. the process industry where large amounts of waste heat are generated at very high temperature levels (often between 800° C. and 1200° C.) or in co-generation situation where heat and electricity are produced by combustion of gas or biomass. A promising material class for such high temperature thermoelectric devices is the group of silicon, silicon composites, silicon alloys or metal-silicides, denoted here as silicon containing materials, especially silicon with enclosed nano-structures, silicon germanium alloys (SiGe), higher manganese silicides (HMS), iron silicide ($FeSi_2$) and magnesium silicide ($Mg_2Si$) (silicides). These silicides are normally tuned to desired properties such as Seebeck voltage, electrical resistivity and thermal conductivity by addition of small traces of dopant materials. A well known example is boron doped SiGe in combination with phosphorous doped SiGe which allows the manufacturing of a p-type conductive material (boron doped SiGe) and a n-type conductive material (phosphorous doped SiGe). Other examples are aluminum doped higher manganese silicide as p-type conductive material or iron doped manganese silicide as n-type material.

As the voltage generated by the Seebeck effect over one thermoelectric element in such a thermoelectric conversion device is typically in the order of 100 mV, a thermoelectric conversion device consists typically of a plurality of thermoelectric elements connected electrically in series by an electrically conductive interconnection. Most preferably such a thermoelectric conversion device consists of two types of thermoelectric elements with a so called p-type conductive element and a n-type conductive element. Alternating these thermoelectric elements in a electrical series interconnection is a preferred method to manufacture a thermoelectric conversion device. However, as is known to the skilled in the art, parallel interconnections and devices consisting of only one type of thermoelectric elements (i.e., p-type or n-type) are possible. In many practical cases such an electrically conductive interconnection makes use of high temperature resistant metals such as nickel or copper. Under oxygen free environments also molybdenum and tungsten are useful elements for electrical interconnection. However due to the high operating temperatures and the long intended operational lifetime of a thermoelectric generator the technical requirements for these electrically conductive interconnections are extremely demanding.

In the process of making thermoelectric conversion devices, thermoelectric elements of at least one but preferably two silicon containing materials comprising silicon, silicon composites, silicon alloys or metal-silicide based materials (one n-type one p-type material) are connected in series using an electrical interconnection with low electrical resistance. These interconnections must fulfill a number of requirements such as:

low electrical resistivity preferably none, or at least acceptably small, performance degradation under high temperature operation sufficient mechanical stability to allow the continuous operation of the thermoelectric module both under cyclic temperature operation as also under long time constant high temperature operation.

The accepted state-of-the-art is that a direct silicon containing material-metal interconnection cannot meet the technical requirements above. The reasons for that are that metals from the metal interconnection layer will diffuse into the thermoelectric (silicide) material and degrade the electrical properties while silicon from the thermoelectric material will react with the metal interconnection forming often very brittle metal silicides at the interface. As these diffusion processes will continue during device operation, such an interconnection is not stable under operation. Additionally silicon, silicon composites, silicon alloys or metal-silicide based material-metal interconnects often show differences in thermal expansion coefficient that lead to thermal stress in the interconnection and to crack formation or breakage of the interconnection.

Consequently, layered interface structures are used to overcome the stability issue and to produce the required properties.

WO2013145843 discloses a thermoelectric conversion module comprising manganese silicide as active material in contact with a Ni, Mo or W electrode using a Cr—Cu alloy stress relief layer in combination with a Ni diffusion barrier layer to prevent the solid-state diffusion of Cr or Cu into the manganese silicide. However, in our test results the proposed structure including a manganese silicide—Ni interface was not stable under long term operation in a high temperature environment. Such a system is expected to have a limited lifetime under high temperature operation.

Publication TW201234688 discloses a low resistivity electrical contact on e.g. magnesium silicide where the electrode material itself is a transition metal silicide or a mixture of transition metal silicide (e.g. nickel silicide, chromium silicide, cobalt silicide, titanium silicide) and possibly a metal. Such a structure provides low electrical resistance contacts to the thermoelectric material itself, however it is not useful for thermoelectric module manufacturing, as transition metal silicides are mechanically not sufficiently stable and in combination with a metal such e.g. Ni will not prevent silicon diffusion into the metal and finally conversion of the metal layer into metal silicide.

Publication JP2005317834 discloses a thermoelectric transformation module that comprises a thermoelectric transformation element of p-type iron silicide ($FeSi_2$); a thermoelectric transformation element of n-type iron silicide ($FeSi_2$); and an electrode member whose surface layer at least is of copper, molybdenum, cobalt, or tungsten. At least, the high temperature side of the thermoelectric transformation element is connected with the electrode member via an interposed layer of silver by a brazing filler metal member. The melting point of the brazing filler metal member is 600-820° C. In this publication a method is described where Ag particles are sintered in the above temperature range. Such a method will not produce a stable silver metal interconnection and is subject to further sintering of the Ag particles during thermoelectric operations and thus very likely unstable.

In general the prior art disclosures to produce low resistivity electrical contacts to silicides lack long term stability due to the diffusion of either metal components of the contacts into the thermoelectric silicide material or silicon from the thermoelectric material into the metallization layer where undesired or detrimental silicides are formed that often form a mechanically brittle material. In addition differences in thermal expansion coefficient lead to high thermal stress in the interconnection and can result in crack forming and finally breakage of the contacts.

An alternative approach to connect different materials based on silicon, silicon composites, silicon alloys or metal-silicides is the direct connection of the two thermoelectric elements without an interconnection metal by a so called p-n junction. This can be achieved by laser welding of the semiconductor metals, or by crystallizing a connected p-n type leg from a melt, or by diffusion of dopants from the surface of the material at high temperature. An example of such a device is described in WO0184641 (A1). Due to the omittance of a metal interconnection contact at the hot side of the elements, such technology overcomes the technical problems around the interconnection between a silicon or metal silicide material with a metallic interconnection. However, p-n junctions are less conductive compared to a metal contact and the conductivity is strongly temperature dependent, changing its rectifying p-n junction behavior to a more ohmic behavior when sufficiently thermally generated charger carrier concentrations are reached. At lower temperatures such a p-n junction is not sufficiently conductive, therefore p-n junction based thermoelectric devices are limited in performance at low and medium temperatures (depending upon the bandgap of the materials, ohmic conduction of a p-n junction might require temperatures of at least 500° C. or above).

In summary, the state of the art in thermoelectric devices based upon silicon containing materials such as silicon, silicon composites, silicon alloys or metal-silicides based materials is that high conductivity Schottky type contacts between the semiconductor and an interconnection metal are not sufficiently stable due to metal silicide formation at the interface and metal interdiffusion into the semiconductor materials. The direct interconnection between two silicon, silicon composites, silicon alloys or metals silicides thermoelectric elements in the form of a p-n junction can result in a stable interconnection, however at a reduced device performance due to the higher resistivity of a p-n junction.

SUMMARY OF THE INVENTION

It is an object of the present invention to provide a thermoelectric conversion device based on silicon, silicon composites, silicon alloys or metal-silicide based materials and a method for manufacturing a thermoelectric conversion device that overcomes or mitigates the above detrimental effects.

The above object is achieved by a thermoelectric conversion device comprising a first and a second active element containing silicon, silicon composites, silicon alloys or metal-silicides. In dependence of the desired conduction type such first and second active element can be doped with different dopants to allow for a combination of a n-type conductive and a p-type conductivity. The elements are interconnected by an interconnection layer that consists of a combination of an interconnection metal and a recrystallized material phase consisting of constituents of the silicon, silicon composites, silicon alloys and metal-silicide based elements. The interconnection metal has the following properties:

The interconnection metal does not react with silicon in the form of an interconnection metal-silicide phase in the solid phase.

The interconnection metal will melt at a temperature below the melting point of any of the first or second thermoelectric elements.

In the molten state the interconnection metal will dissolve at least one of the components of the thermoelectric elements, preferably the silicon element, or all components of the thermoelectric elements in the composition as exists in the elements. The solubility of components of the thermoelectric elements in the molten interconnection metal will be limited to a certain value, but will increase if the temperature of the liquid interconnection metal is increased.

In the solid state the interconnection metal has a low solubility for any of the components of the thermoelectric elements.

Silicon containing material such as silicon, silicon composites, silicon alloys or metal-silicide based materials is considered to contain at least 50 at % Si.

As is described below in the examples, such metals that do not form an interconnection metal-silicide do exist in the case of silicon, silicon composites, silicon alloys and metal-silicide based thermoelectric materials. Examples are tin, zinc, aluminum, silver, germanium. Other metals are beryllium, gold, and antimony.

Examples of some, frequently used metals that form interconnection metal-silicides and thus do not meet the description above are iron, copper, chromium, nickel, platinum and titanium. Such thermoelectric elements in combination with the interconnection metal will allow for an interconnection process where an assembly of two thermoelectric elements with the interconnection metal between them is heated to a temperature above the melting point of the interconnection metal. In contrast to the interconnection processes as outlined in the patents above, the interconnection metal is completely melted and liquid in this process. During the heating up of the liquid interconnection metal, a certain amount of at least one component but preferably all components of the thermoelectric elements are dissolved in the melt. After some time in the interconnection process the assembly will be cooled down, causing the dissolved components of the thermoelectric materials to crystallize from the liquid interconnection metal melt due to the reduced solubility. At the solidification point of the interconnection metal melt, the remaining components of the thermoelectric elements in the liquid interconnection melt also have to crystallize due to the low solubility of the elements in the solidified interconnection metal.

As a result of this process an electrical and mechanical interconnection between at least two thermoelectric elements is produced that consists of at least two different phases, a recrystallized phase of components from the thermoelectric elements and a solidified interconnection metal phase.

The advantages of such a process compared to the state of the art are that due to the properties of the selected interconnection metals the assembly becomes chemically inert in the solid state. In the areas where the interconnection metal connects the two thermoelectric materials a low electrical resistance interconnect is realized due to the Schottky contact behavior at the metal-thermoelectric element interface. The connected recrystallized thermoelectric material forms a less electrically conductive p-n junction that provides a high mechanical stability to the interconnection system.

The ratio between recrystallized thermoelectric elements and interconnection metal can be adjusted by process parameters such as the maximum temperature during the interconnection metal melting process. The form of the recrystallized thermoelectric elements phase can be adjusted by the resolidification temperature traject. Doing so the recrystallized phase can be controlled to form a homogeneous layer on the thermoelectric elements with a solidified metal layer in between. Such conditions would result in high electrical conductivity with reduced mechanical strength of the interconnection. If the recrystallization process is done at a different cooling rate, the recrystallization front is destabilised resulting in recrystallized interconnections between the thermoelectric elements. Such a system has an advantage with respect to mechanical stability at the expense of a slightly lower electrical conductivity. As a consequence such process yields the necessary process adjustments to allow the manufacturing of a thermoelectric generator according to its functional requirements.

Another advantage of this system is that the amount of metal in the metal interconnection is typically low with a preferred interconnection metal layer thicknesses between 5 μm and 500 μm.

BRIEF DESCRIPTION OF DRAWINGS

The invention will be explained in more detail below with reference to drawings in which illustrative embodiments thereof are shown. They are intended exclusively for illustrative purposes and not to restrict the inventive concept, which is defined by the appended claims.

DETAILED DESCRIPTION OF EMBODIMENTS

Figure 1:
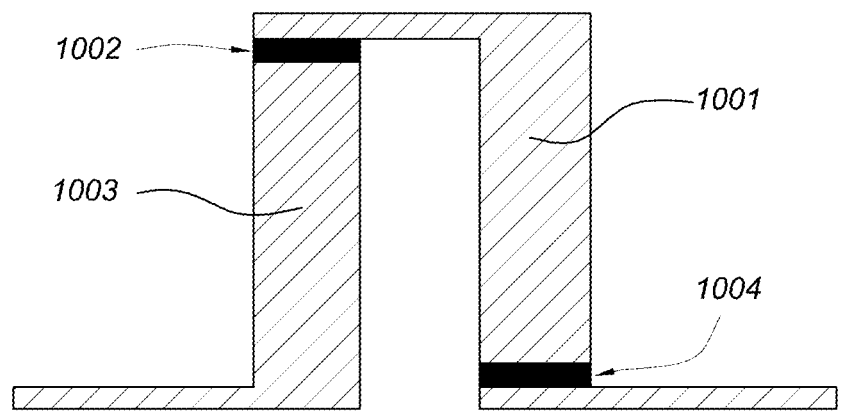
FIG. 1 shows a cross-sectional view of a thermoelectric conversion device according to an embodiment of the present invention.

FIG. 1 shows a cross-sectional view of a thermoelectric conversion device according to an embodiment of the present invention.

According to an embodiment, a thermoelectric conversion device comprises a plurality of thermoelectric elements 1001 and 1003, also denoted as "active elements", from a silicon, silicon composites, silicon alloys or metal-silicide based material. Such thermoelectric elements may have a shape of a bar.

Each thermoelectric element 1001; 1003 comprises a contact interface to an interconnection zone 1002 and a second interconnection zone 1004; For example, these contact and counter interfaces are formed at the respective ends of the bar shape. During use of the thermoelectric element one contact interface (e.g., the first contact interface) is kept at a relatively high temperature, i.e., a hot side positioned in a zone with relatively high temperature and the other, first counter interface as cold side is kept at relatively low temperature, positioned in a zone with, in comparison to the zone with high temperature, a relatively low temperature.

The thermoelectric elements 1001; 1003 are connected in series by providing a metal interconnect zone 1002. According to the invention, the interconnection zone 1002 which may be a strip-like element, consists of a volume of interconnection metal and a volume of re-crystallized components of the thermoelectric elements.

The second interconnection zone 1004 may preferably be made of the same components as the first interconnection zone 1004. However due to the difference in operation temperature other interconnection metals may be applied.

In an embodiment, the thermoelectric elements 1001; 1003 are "L"-shaped and made of one piece. Alternatively, the thermoelectric elements 1001; 1003 may each consist of two legs of the same material that are jointed by heat treatment to form the L-shape.

Figure 2:
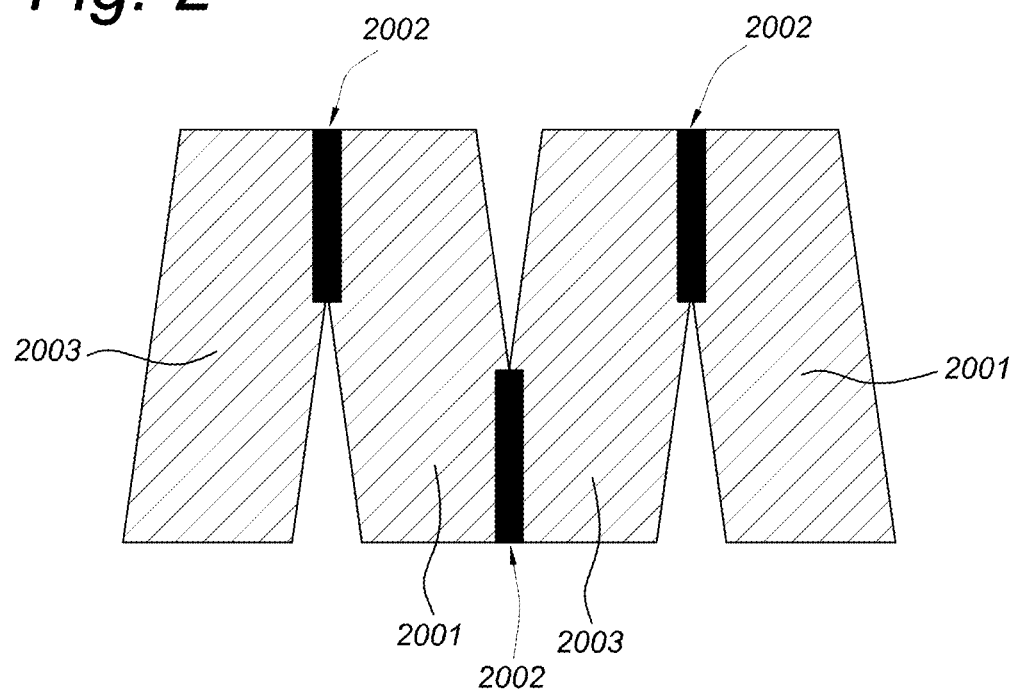
FIG. 2 shows a cross-sectional view of another thermoelectric conversion device according to an embodiment of the present invention.

FIG. 2 shows a cross-sectional view of a thermoelectric conversion device according to an embodiment of the present invention.

According to an embodiment, a thermoelectric conversion device comprises a plurality of thermoelectric elements 2001 and 2003, also denoted as "active elements", from a silicon, silicon composites, silicon alloys or metal-silicide based material. Such thermoelectric elements may have a shape of a bar.

Each thermoelectric element 2001; 2003 comprises a contact interface to an interconnection zone 2002 on the hot side and the cold side; According to the invention, the interconnection zone 2002 which may be a strip-like element, consists of a volume of interconnection metal and a volume of re-crystallized components of the thermoelectric elements.

Figure 3:
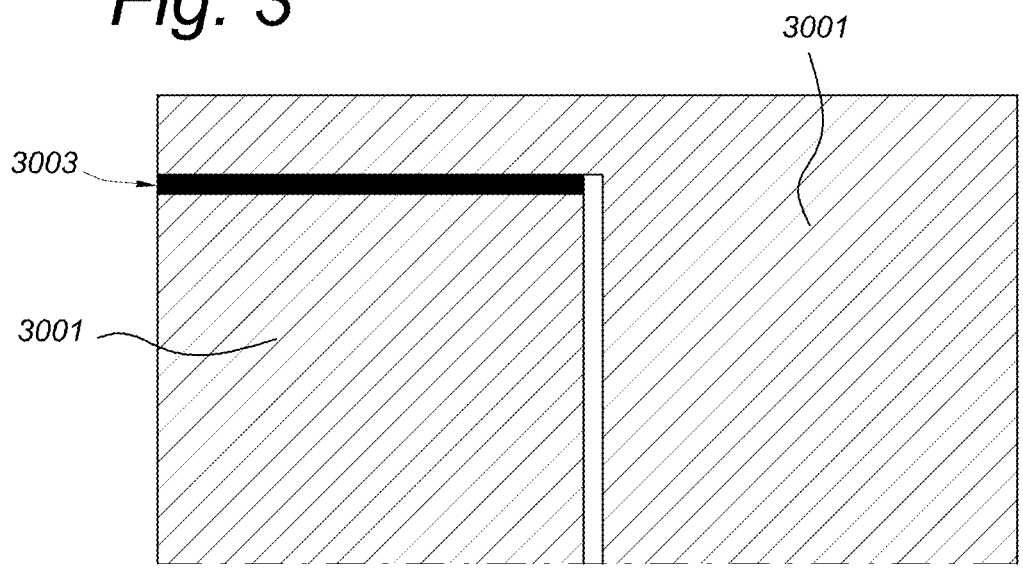
FIG. 3 shows a cross-sectional view of the interconnection scheme of a thermoelectric conversion device according to an embodiment of the present invention before the manufacturing process.

FIG. 3 shows a cross section scheme of the interconnection prior to the manufacturing process. The thermoelectric elements 3001; 3003 are positioned with a metal interconnection layer 3002 in between the respective contact interfaces.

Figure 4:
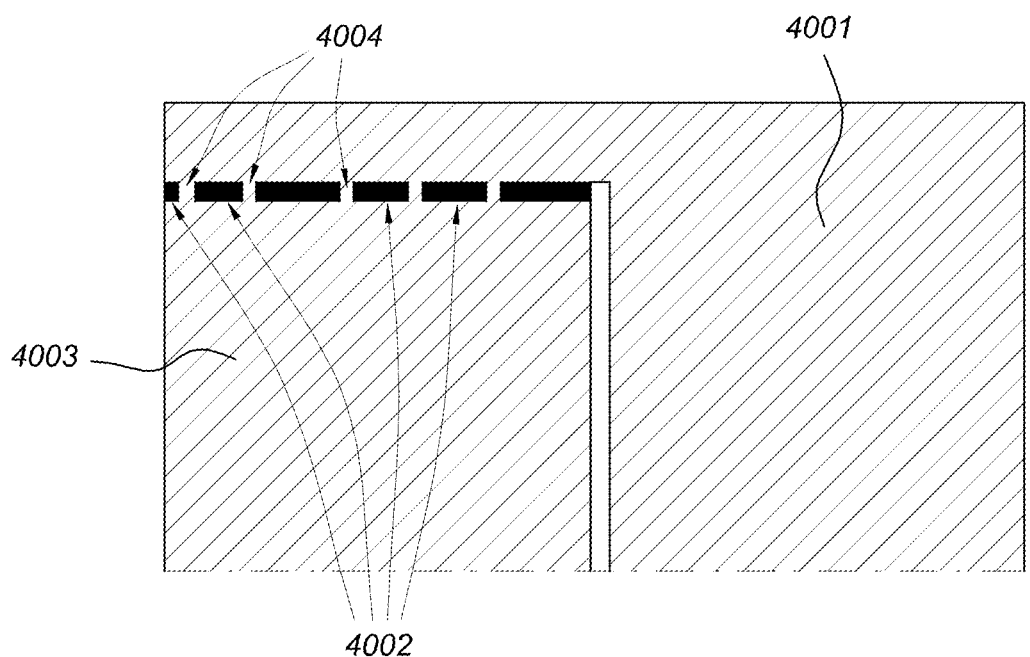
FIG. 4 shows a cross-sectional view of the interconnection scheme of a thermoelectric conversion device according to an embodiment of the present invention after the manufacturing process.

FIG. 4 shows a cross section of the interconnection after the manufacturing process. The thermoelectric elements 4001; 4003 were partially dissolved in the liquid interconnection metal and re-crystallized during the cooling process. Such re-crystallization can be in form of pillars 4004 connecting the thermoelectric elements 4001; 4003. In between the pillars the solidified interconnection metal 4002 forms the conductive contact.

Figure 5:
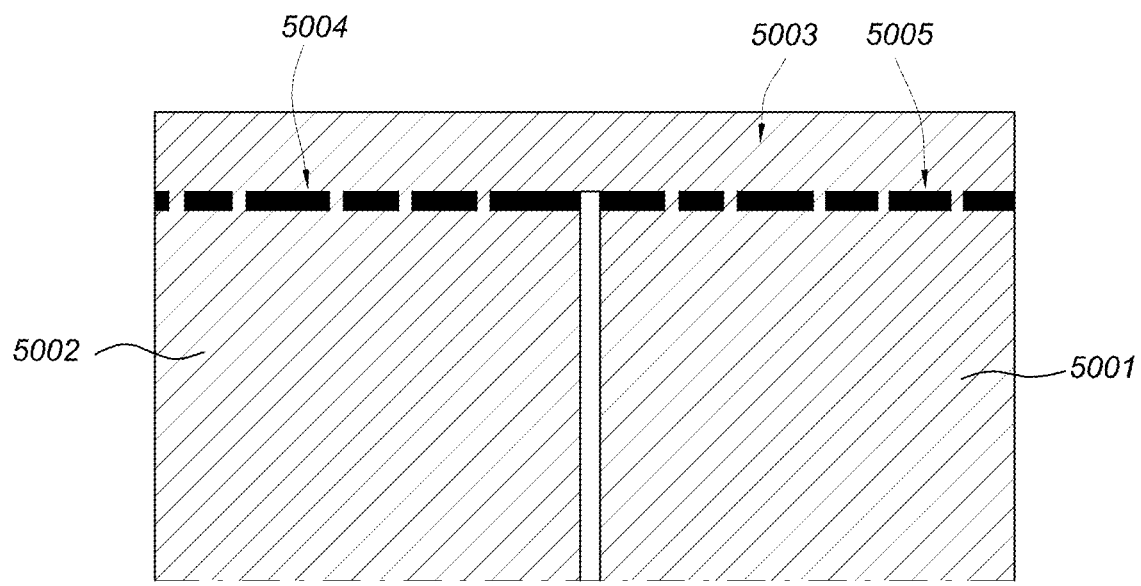
FIG. 5 shows a cross-sectional view of the interconnection scheme of a thermoelectric device according to another embodiment of the present invention after the manufacturing process.

FIG. 5 shows a cross section of the interconnection after the manufacturing process. One of the two thermoelectric elements 5001, is connected via a recrystallized elements-interconnection metal layer 5005 to a connecting element 5003 of the same material. The connecting element 5003 is than connected to the second thermoelectric element via the recrystallized elements-interconnection metal layer 5004.

Figure 6:
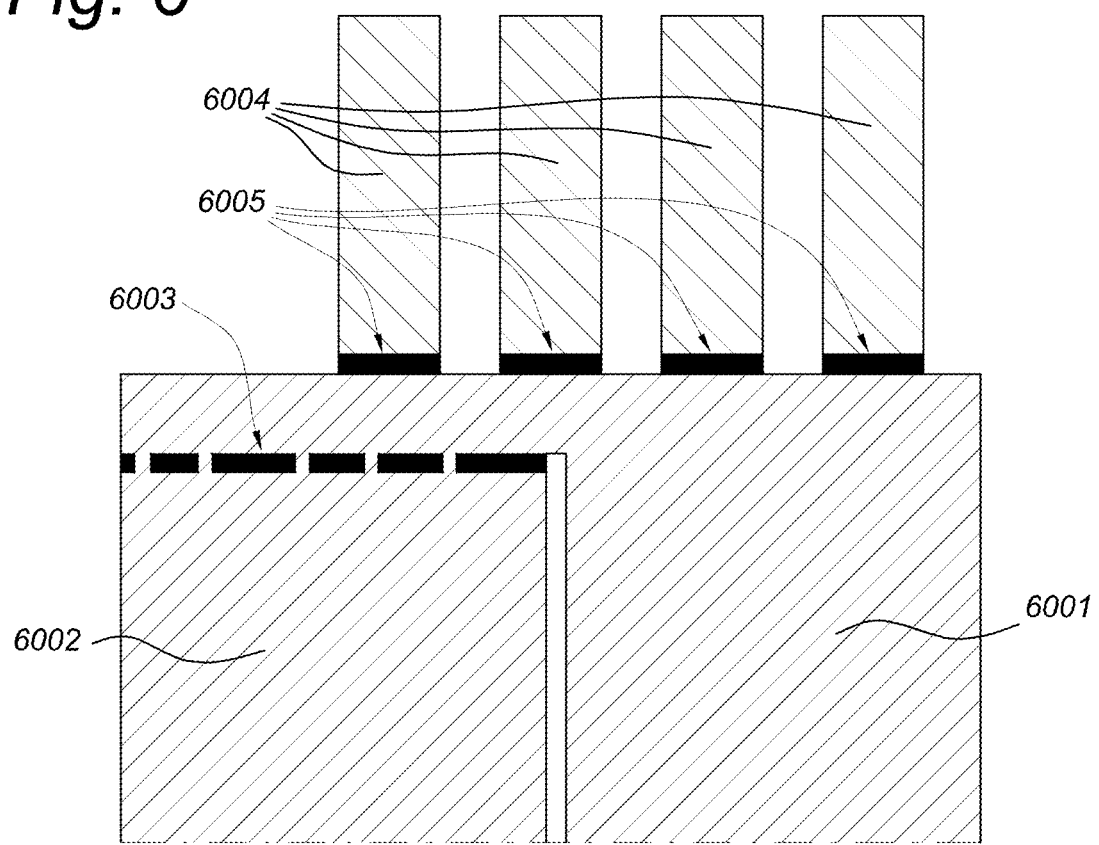
FIG. 6 shows a cross-sectional view of the interconnection scheme of a thermoelectric device according to another embodiment of the present invention after the manufacturing process.

FIG. 6 shows a cross section of another thermoelectric device after the manufacturing process. The thermoelectric elements 6001 and 6002 are connected together via the recrystallized thermoelectric elements-metal interconnection layer 6003. On the thermoelectric element 6001 a third silicon, silicon composites, silicon alloys or metal-silicide based component 6004 is conductively connected using the same interconnection process 6005. Such structures are useful as heat exchangers in cases where the heat flux over the thermoelectric system is transferred from a liquid or gaseous material.

Figure 7:
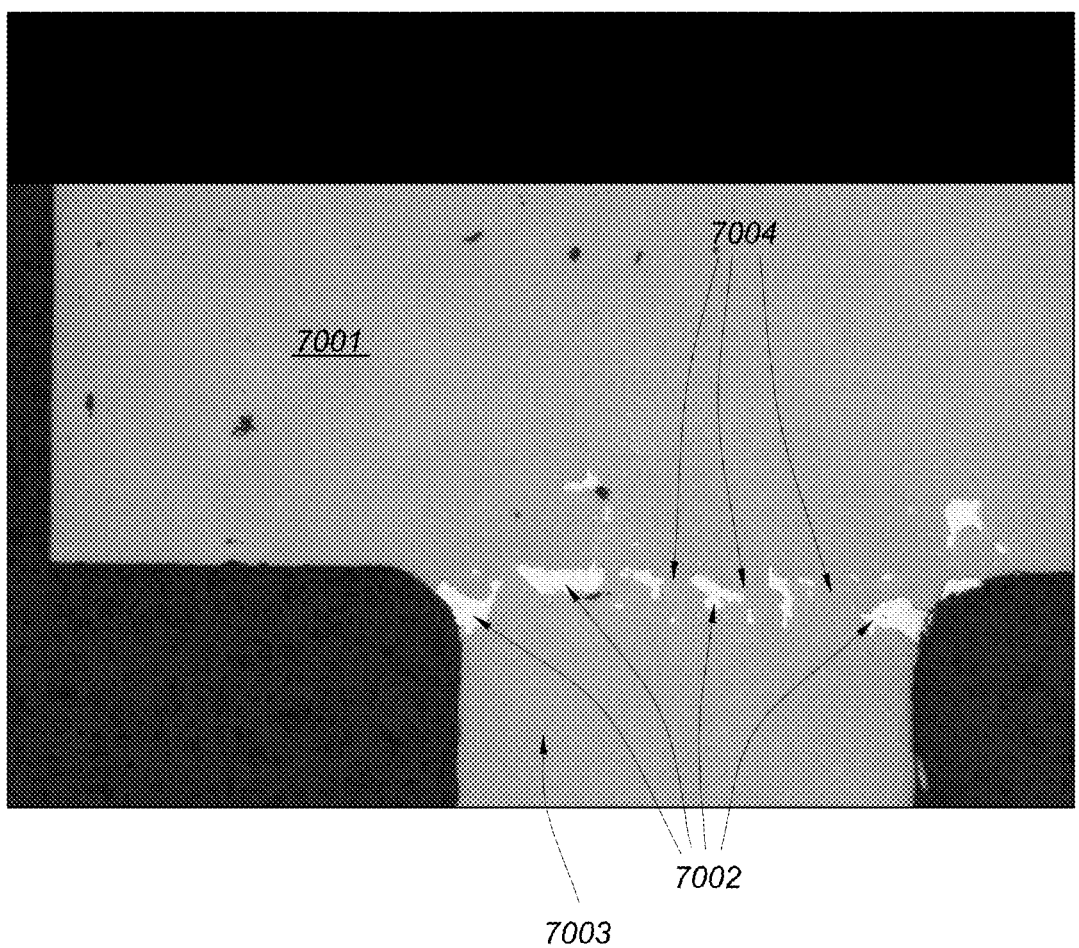
FIG. 7 shows a photograph of a cross-sectional microscopic view of an actual interconnection of a thermoelectric conversion device according to an embodiment of the present invention after the manufacturing process.

FIG. 7 shows a microscopic picture of an actual cross section of two thermoelectric elements 7001; 7003 connected in accordance with an embodiment of this invention. In the re-crystallized interconnection zone, the interconnection metal 7002 is visible as light areas. In between the interconnection metal 7002 the thermoelectric material is re-crystallized 7004.

Figure 8:
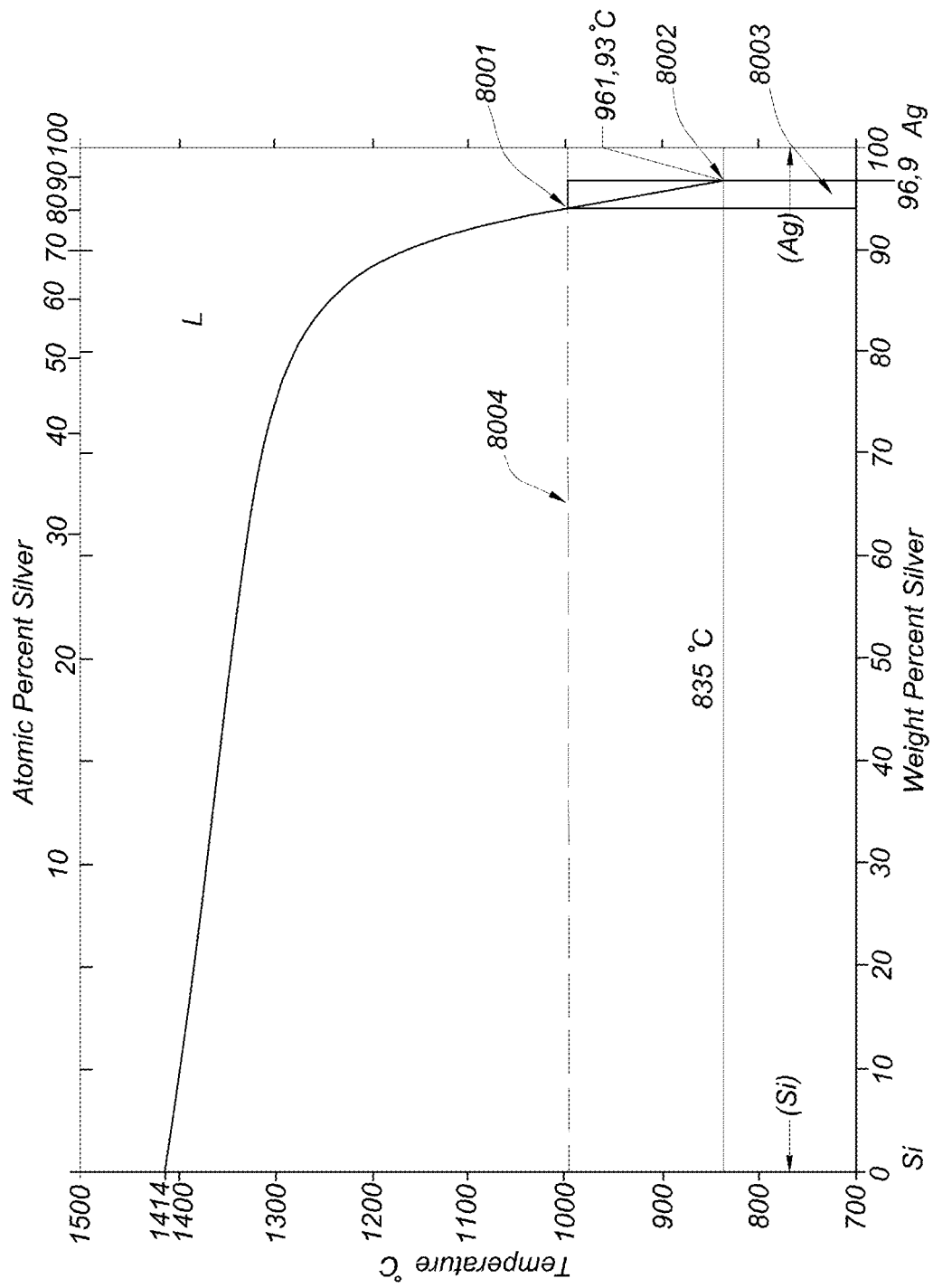
FIG. 8 shows the phase diagram of the silver-silicon system.

FIG. 8 shows the phase diagram of the silver-silicon system according to R. W. Olesinski and G. J. Abbaschian (Binary Alloy Phase Diagrams, American Society for Metals, 1986). The dashed line 8004 indicates a processing temperature at 1000° C. In a typical embodiment of the invention, there would be a large amount of silicon in the thermoelectric elements and a limited amount of liquid silver. Therefore the system would be at the thermodynamic steady state point 8001. During cooling down, the system would develop along the solid Si-liquid Ag line towards the eutectic point 8002. During this cooling down period, the grey area 8003 indicates the amount of silicon that has to solidify under steady state conditions. It might be clear that this binary system is a simplification of a real system and only serves to illustrate the principle.

Figure 9:
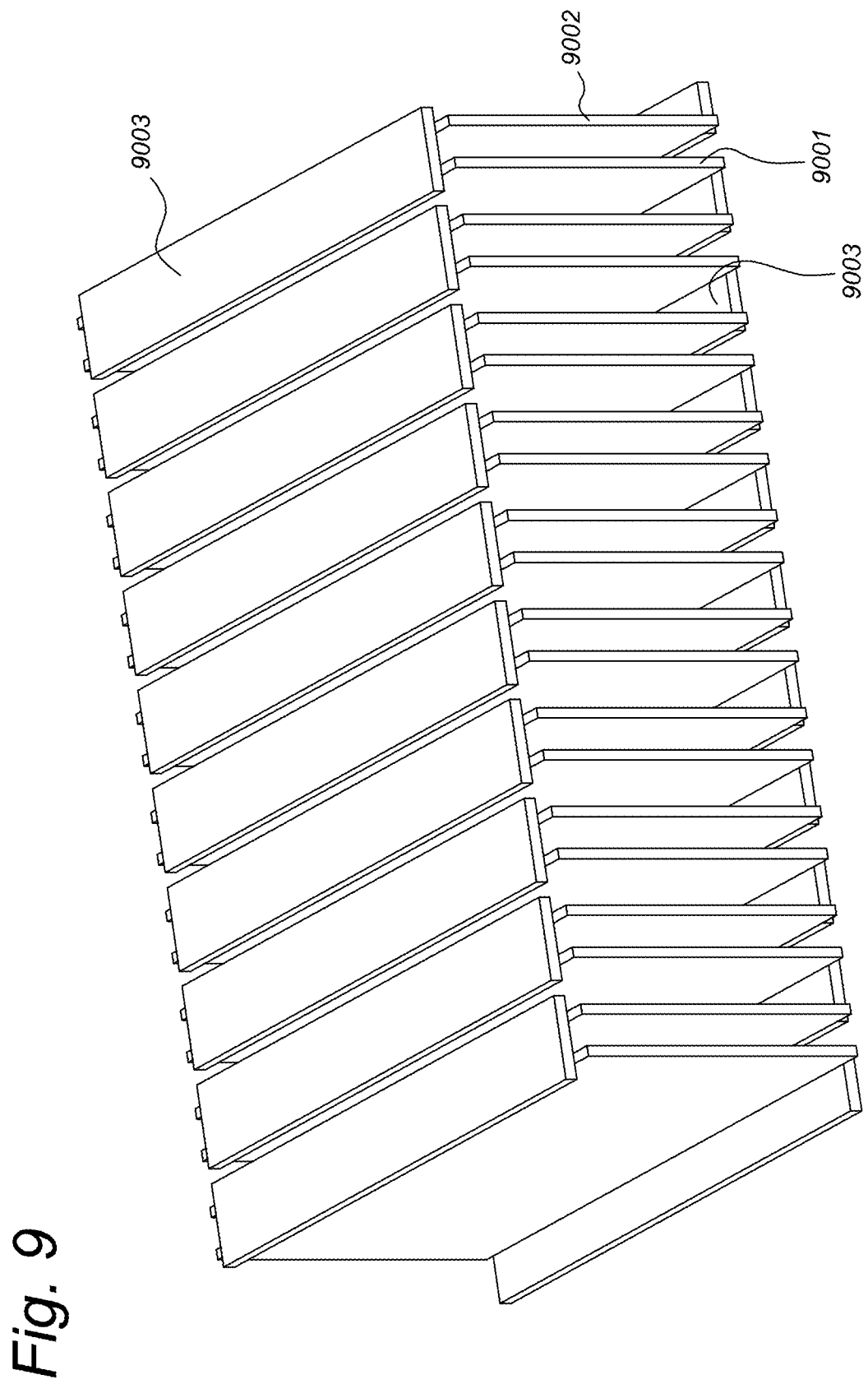
FIG. 9 shows diagramatically a perspective view of a thermoelectric device build according to an embodiment of the present invention.

FIG. 9 shows schematically a cross section of an actual thermoelectric conversion device manufactured according to an embodiment of the present invention.

As an example: phosphorous doped SiGe alloy can be used to manufacture a first type of n-type conductive thermoelectric elements 9001; boron doped SiGe can be used as a second type of p-type conductive thermoelectric elements 9002; these first and second elements 9001; 9002 can be interconnected using a connecting element 9003 and a silver interconnection metal between the first element 9001 and the connecting element 9003 and between the second element 9002 and the connecting element 9003, similar as shown in FIG. 5.

All components are mounted in a positioning tool with a layer of the Ag interconnection metal in between the contacting surfaces. During a furnace process, where the Ag interconnection metal layer is melted, the interface is manufactured in accordance with the invention. The furnace process could have a top temperature above the melting point of Ag at 962° C. such as 1000° C. After holding the top temperature for a certain amount of time to allow the dissolution of material from components of the thermoelectric elements in the interconnection metal melt, the recrystallization process is started by cooling down. Depending upon the change in solidification temperature due to the dissolved components of the thermoelectric elements, the solidification temperature will vary from the melting temperature of Ag.

For manufacturing purposes, the Ag interconnection metal layer in this example may be applied in form of a Ag foil that is positioned in between the thermoelectric elements; other application methods are evaporation of Ag on the surfaces, plating of a Ag layer or screen printing an Ag particle containing paste. However many other manufacturing processes such as chemical or physical vapor deposition, plasma deposition or sputtering are well known in industry and can be applied in accordance with this invention.

It is also possible to use other metals or metal alloys that have the characteristics that such an interconnection metal:
  does not react with silicon in the form of an interconnection metal-silicide phase in the solid phase;
  will melt at a temperature below the melting point of any of the first or second thermoelectric element;
  that in the molten state will dissolve at least one of the components of the thermoelectric elements, preferably the silicon element, most preferably all components of the thermoelectric elements in the composition as exists in the elements, with a solubility of components of the thermoelectric elements in the molten interconnection metal that is limited to a certain value, but will increase if the temperature of the liquid interconnection metal is increased;
  that in the solid state has a low solubility for any of the components of the thermoelectric elements.

Commercially available examples of such interconnection metal alloys are e.g., AgAl, or AgGe. Other metals that show the desired characteristics are e.g. Zn, Sn, Al, Ge. Also, Au, Be and Sb have these desired characteristics. Obviously, alloys or mixtures of metals from these families can also be applied.

It is also possible to use mixtures or alloys of such interconnection metals with components of the thermoelectric elements. Such compositions can be useful to control melting and solidification temperature and the amount of dissolved components of the thermoelectric elements.

Additionally, it should be mentioned that it can be advantageous to apply different interconnection metals for e.g. the hot side of the thermoelectric generator and the cold side of the thermoelectric generator as the operating temperature within the thermoelectric device of the interfaces will typically be different. Such a thermoelectric device could use a Ag interconnection metal to establish the interconnection of elements of the thermoelectric device in the areas operating under high temperatures in combination with the lower melting temperature Zn to establish the interconnection of parts of the thermoelectric device in the colder areas. It is now obvious that by using this invention for the high temperature interconnection, thermoelectric devices that combine this invention with other well known interconnection processes in colder parts are possible.

The interconnection method of this invention also allows the mechanical, thermal and electrical interconnection of thermoelectric elements of the same type or other structural components as part of a thermoelectric generator. Therefore this method can be used to attach structural components such as highly thermally conductive fins of a heat exchanger to the thermoelectric elements. Another possibility is to produce more complex geometrical shapes of the same type of thermoelectric element by connecting them together with the interconnection process of this invention. This enables the design of thermoelectric generators in a very efficient and flexible way as is obvious to the skilled in the art.

Another example uses higher manganese silicide material with e.g. vanadium, chromium or aluminum dopant as p-type thermoelectric element in combination with higher manganese silicide with iron or ruthenium dopant as n-type thermoelectric element.

It is also possible to combine silicides from different families in a manufacturing process as described in this invention under the condition that the silicide materials are sufficiently matched in thermal expansion coefficient. Such material combination are typically found when the thermoelectric or structural materials differ only in minor components such as addition of dopants or small percentages of an alloying component.

In an embodiment, the method of this invention uses a single high temperature process that allows to manufacture thermoelectric devices in a controlled way. The process itself can be described as mechanically stacking the thermoelectric silicon alloy in contact with the interconnection metal material. This mechanical stack is heated in a gas atmosphere that substantially prevents the formation of surface oxides, in a furnace, where the mechanical stack is heated to a temperature where only the interconnection metal as the lowest melting temperature component becomes liquid. As soon as the interconnection metal is liquid, components from the thermoelectric materials will be dissolved up to the solubility limit in the interconnection metal. The amount of dissolved components of the thermoelectric elements can be controlled by the amount of liquid interconnection metal and the overheating of the melt in dependence of the solubility. After a certain holding time the furnace temperature will be reduced to allow solidification of the dissolved components of the thermoelectric elements from the interconnection metal melt. At the solidification temperature of the mixture of molten interconnection metal and dissolved components of the thermoelectric elements, the system will solidify.

It will be obvious to the skilled in the art, that this process can be easily varied by changing process environments (vacuum, protective gas, reducing atmosphere), process times and process temperatures. It might be useful to foresee a time interval with a holding temperature during heating up to allow surface contaminations such as water to leave the surface of the components in the furnace. Also, surface oxides of the silver or metal components can be removed in a suitable heating up cycle. It is also possible and advantageous to lower the melting temperature of the interconnection metal by adding alloying materials. There are many other mixtures or alloying compositions possible for an interconnection metal, as long as the interconnection metal components do not form a silicide phase. Such non-silicide forming materials are e.g., Ag, Al, Ge, Sn, Zn. Also, Au, Be and Sb can be used.

With this process the desired layered structure is formed in a single process step however two step processes using different interconnection metals at different furnace temperatures will now be obvious.

In the foregoing description of the figures, the invention has been described with reference to specific embodiments thereof. It will, however, be evident that various modifications and changes may be made thereto without departing from the scope of the invention as summarized in the attached claims.

In addition, modifications may be made to adapt a particular situation or material to the teachings of the invention without departing from the essential scope thereof. Therefore, it is intended that the invention not be limited to the particular embodiments disclosed, but that the invention includes all embodiments falling within the scope of the appended claims.

In particular, combinations of specific features of various aspects of the invention may be made. An aspect of the invention may be further advantageously enhanced by adding a feature that was described in relation to another aspect of the invention.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. A method for manufacturing a thermoelectric conversion device comprising at least a first and a second active conductive thermoelectric element, each of the first and second active thermoelectric elements based on having a strip shape or bar shape and based on silicon, silicon composites, silicon alloys or metal-silicides, and a first type interconnection zone consisting of a first interconnection metal phase material and a first recrystallized thermoelectric element component phase material between the first and the second active thermoelectric element, characterized in that the interconnection metal phase material:
   does not react with silicon to form a metal-silicide phase in the solid state;
   melts at a temperature below a melting point of any of the first or second thermoelectric element materials;
   in the molten state, dissolves at least one of the constituents of the thermoelectric elements, while a solubility of said one or more constituents of the thermoelectric elements in the melt is limited, but increasing with higher temperature, and
possesses a low solubility for any of the constituents of the thermoelectric elements in the solid state, lower than the solubility thereof in the molten state,
wherein the method comprises:
placing at least the first active thermoelectric element and the second active thermoelectric element in an assembly with a desired geometry of the thermoelectric device to be formed, with a first interconnection metal arranged in between first surfaces where the first and second active thermoelectric elements are to be connected;
heating the assembly of the first and second active thermoelectric elements to a first temperature above a solidification point of the first interconnection metal to create a first liquid interconnection metal while allowing constituents of the first and second thermoelectric elements to dissolve in the first liquid interconnection metal;
cooling down the assembly in a controlled manner to form the first type first interconnection zone consisting of the first interconnection metal phase material and the first recrystallized thermoelectric element component phase material between said first surfaces of the first active thermoelectric element and the second active thermoelectric element.

2. The method for manufacturing according to claim 1, further comprising that during said heating of the assembly at an interface between the first interconnection metal and one or more functional components of the thermoelectric conversion device, constituents of said silicon, silicon composites, silicon alloys or metal-silicides dissolve in the first liquid interconnection metal, and that during cooling down at said interface the first type interconnection zone consisting of a recrystallized metal phase as said first interconnection metal phase material and a recrystallized silicon containing material as said first recrystallized thermoelectric element component phase material is formed.

3. The method for manufacturing according to claim 1, further comprising:

during said placing at least the first active thermoelectric element and the second active thermoelectric element in the assembly with the desired geometry of the thermoelectric device to be formed:

arranging a second interconnection metal arranged in between second surfaces where the first and second active thermoelectric elements are to be connected;

in which said heating of the assembly of the first and second active thermoelectric elements to the first temperature above a solidification point of the second interconnection metal includes: creating a second liquid interconnection metal while allowing constituents of the first and second active thermoelectric elements to dissolve in the second liquid interconnection metal; and in which said cooling down the assembly in a controlled manner includes: forming a second type interconnection zone consisting of a second recrystallized metal phase material and a second recrystallized thermoelectric element component phase material between said second surfaces of the first and the second active thermoelectric element, wherein the second interconnection metal phase material differs from said first interconnection metal phase material.

4. The method for manufacturing according to claim 1, further comprising after forming the first type interconnection zone consisting of the first recrystallized metal phase material and the first recrystallized thermoelectric element component phase material between said first surfaces of the first active thermoelectric element and the second active thermoelectric element:

arranging a second interconnection metal in between second surfaces where the first and second active thermoelectric elements are to be connected;

heating the assembly of the first and second active thermoelectric elements to a second temperature above a solidification point of the second interconnection metal to create a second liquid interconnection metal while allowing constituents of the first and second active thermoelectric elements to dissolve in the second liquid interconnection metal;

cooling down the assembly in a controlled manner to form a second type interconnection zone consisting of a second recrystallized metal phase material and a second recrystallized thermoelectric element component phase material between said second surfaces of the first and the second active thermoelectric element, wherein the second interconnection metal differs from said first interconnection metal and the second temperature is lower than the first temperature.

5. The method for manufacturing according to claim 1, wherein the first or second interconnection metal phase material is mainly based either on at least one element selected from a group consisting of Ag, Al, Ge, Sn, Zn, or on mixtures or alloys of at least two elements selected from said group.

6. The method for manufacturing according to claim 1, wherein the first or second interconnection metal is based either on at least one element selected from a group of Ag, Al, Ge, Sn, Zn, or on mixtures or alloys of at least two elements selected from said group with addition of one or more of the constituents of the thermoelectric materials.

7. The method for manufacturing according to claim 1, wherein the first or second interconnection metal has an initial thickness between 5 µm and 500 µm when arranged in between surfaces where the first and second thermoelectric elements are to be connected, before said heating of the assembly.

8. The method for manufacturing according to claim 3, wherein the second interconnection metal phase material is mainly based either on at least one element selected from a group consisting of Ag, Al, Ge, Sn, Zn, or on mixtures or alloys of at least two elements selected from said group.

9. The method for manufacturing according to claim 3, wherein the second interconnection metal is based either on at least one element selected from a group of Ag, Al, Ge, Sn, Zn, or on mixtures or alloys of at least two elements selected from said group with addition of one or more of the constituents of the thermoelectric materials.

10. The method for manufacturing according to claim 3, wherein the second interconnection metal has an initial thickness between 5 µm and 500 µm when arranged in between surfaces where the first and second thermoelectric elements are to be connected, before said heating of the assembly.

* * * * *